United States Patent [19]
Lee

[11] Patent Number: 5,481,474
[45] Date of Patent: Jan. 2, 1996

[54] DOUBLE-SIDED PLACEMENT OF COMPONENTS ON PRINTED CIRCUIT BOARD

[75] Inventor: Tsu-chang Lee, San Jose, Calif.

[73] Assignee: Cadence Design Systems, Inc., San Jose, Calif.

[21] Appl. No.: 96,604

[22] Filed: Jul. 22, 1993

[51] Int. Cl.⁶ .................................................. H05K 13/04
[52] U.S. Cl. ......................... 364/491; 364/489; 364/490
[58] Field of Search .................................... 364/491, 490, 364/489, 488, 468

[56] References Cited

U.S. PATENT DOCUMENTS

| | | | |
|---|---|---|---|
| 4,613,940 | 9/1986 | Shenton et al. | 364/490 |
| 4,754,408 | 6/1988 | Carpenter et al. | 364/491 |
| 4,805,113 | 2/1989 | Ishii et al. | 364/491 |
| 4,815,003 | 3/1989 | Putatunda et al. | 364/491 |
| 4,839,821 | 6/1989 | Murakata | 364/491 |
| 5,050,091 | 9/1991 | Rubin | 364/488 |
| 5,187,668 | 2/1993 | Okude et al. | 364/468 |
| 5,222,031 | 6/1993 | Kaida | 364/491 |
| 5,349,536 | 9/1994 | Ashtaputre et al. | 364/491 |
| 5,359,538 | 10/1994 | Hui et al. | 364/491 |
| 5,363,313 | 11/1994 | Lee | 364/491 |
| 5,381,343 | 1/1995 | Bamji et al. | 364/488 |

Primary Examiner—Kevin J. Teska
Assistant Examiner—Russell W. Frejd
Attorney, Agent, or Firm—John T. McNelis; Philip E. Blair

[57] ABSTRACT

A computer-aided engineering (CAE) tool simulates physical floor-planning of electronic components to be placed and interconnected on both sides of a printed circuit board (PCB). Initially components are placed in a raw portion of the PCB, until an evaluator determines where to re-place selected components in refined portions on both sides of the PCB. The evaluation process is repeated until all components are selected from the raw portion and re-placed in a refined portion. During evaluation, a profile of the raw portion is generated, and the generated profile is searched for a location for placing each selected component.

20 Claims, 3 Drawing Sheets

(1)

DOUBLE-SIDED PLACEMENT OF COMPONENTS ON PRINTED CIRCUIT BOARD

CROSS-REFERENCE TO PRIOR APPLICATION

This application is related to prior, copending U.S. application, Ser. No. 07/843,712, filed Feb. 28, 1992, which is hereby incorporated by reference.

BACKGROUND OF THE INVENTION

1. Field of the Invention

The invention relates to computer-aided engineering tools for designing electronic systems, particularly to software tools for defining component placement and interconnection on double-sided printed circuit boards.

2. Description of the Background Art

In designing complex electronic systems, computer-aided engineering (CAE) tools are used to define certain system functionality, typically by specifying what electrical components are included in the system and how such components are interconnected. In addition, such CAE tools may be used for laying-out physically the system components and interconnections routed therebetween, typically on a printed circuit board (PCB) or a semiconductor substrate ("chip").

For practical reasons, such as reducing manufacturing cost or increasing system performance, it is desirable to place and interconnect components on the PCB or chip in an efficient or "packed" manner. In this way, more component functionality may be placed on a given substrate, and the length of signal wires interconnecting components placed thereon is minimized. Additionally, other system constraints may be imposed on the design lay-out, such as preferred placement of components or signal paths having critical timing, as well as thermal or power limitations on the design.

More recently, in the case of double-sided PCBs, whereby components are placed and interconnected on both sides of a common substrate, it would be desirable to provide a CAE tool which places and interconnects components according to practical design constraints.

SUMMARY OF THE INVENTION

The invention resides in placing electronic components on both sides of a printed circuit board (PCB) by placing components initially in a "raw" portion of the PCB, and then re-placing selected components in "refined" portions on both sides of the PCB according to an evaluation of each selected component.

The evaluation process involves calculating a placement "cost" for various possible component positions and is repeated until all selected components are re-placed in the refined portions. In particular, a profile of the raw portion is generated during evaluation, such that the generated profile is searched for a location to place each selected component.

DESCRIPTION OF THE PREFERRED EMBODIMENT

The preferred embodiment is a computer-aided engineering (CAE) software and hardware tool which defines and/or simulates physical floor-planning of electronic components for placement and interconnection on multiple sides of one or more fixed or variable-size printed circuit boards (PCBs), preferably having at least one straight or flat side or being rectangular in shape.

It is contemplated that such CAE system, as used by a design engineer, is implemented as one or more application software programs and related data files stored and executed in one or more computer system.

Generally, in accordance with the present invention, various rectilinearly-shaped or rectangular objects or symbols, each representing a particular electronic component, as specified in a netlist or hardware description file provided by a conventional Electronic Design Automation (EDA) facility for defining components interconnected in a particular prototype system, are placed or positioned initially in a pre-defined or user-selected "raw" or unrefined portion or sub-area in a side or sides of a particular PCB, by assigning certain relative horizontal and vertical coordinates to locate each such component therein, as part of a simulated iterative process for floor-planning or trial placement.

In this way, it is contemplated that eventually a certain floor planning or object placement will be evaluated to be satisfactory, and physical placement of real components on such PCB can proceed to actual manufacturing thereof.

To achieve satisfactory component placement on multiple PCB sides, an evaluation is performed while calculating a relative cost or packing value to determine where and how geometrically to re-place selected components in refined portions on certain PCB sides. Preferably, the cost is determined by subtracting, for each object placement possibility, a pre-defined frame or total board size from an iteratively-determined size of a bounding box or profile that accomodates all objects in the current design placement (i.e., packing cost=design size–frame size, while design size>frame size).

The evaluation process is repeated until all components are selected from the raw portion and re-placed in a refined portion.

Figure 1:
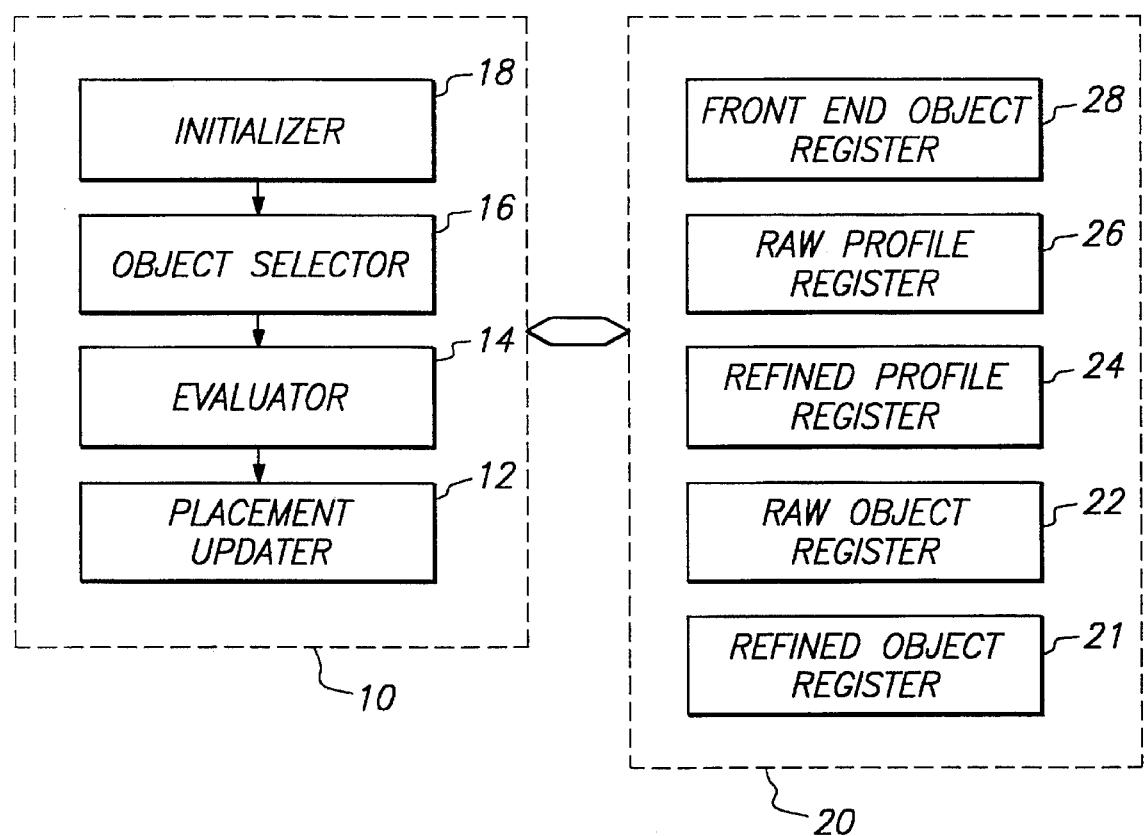
FIG. 1 is a general block diagram of software modules 10 and data structures 20 used by a computer-aided engineering (CAE) tool for placing components on both sides of a printed circuit board.
Figures 2, 4:
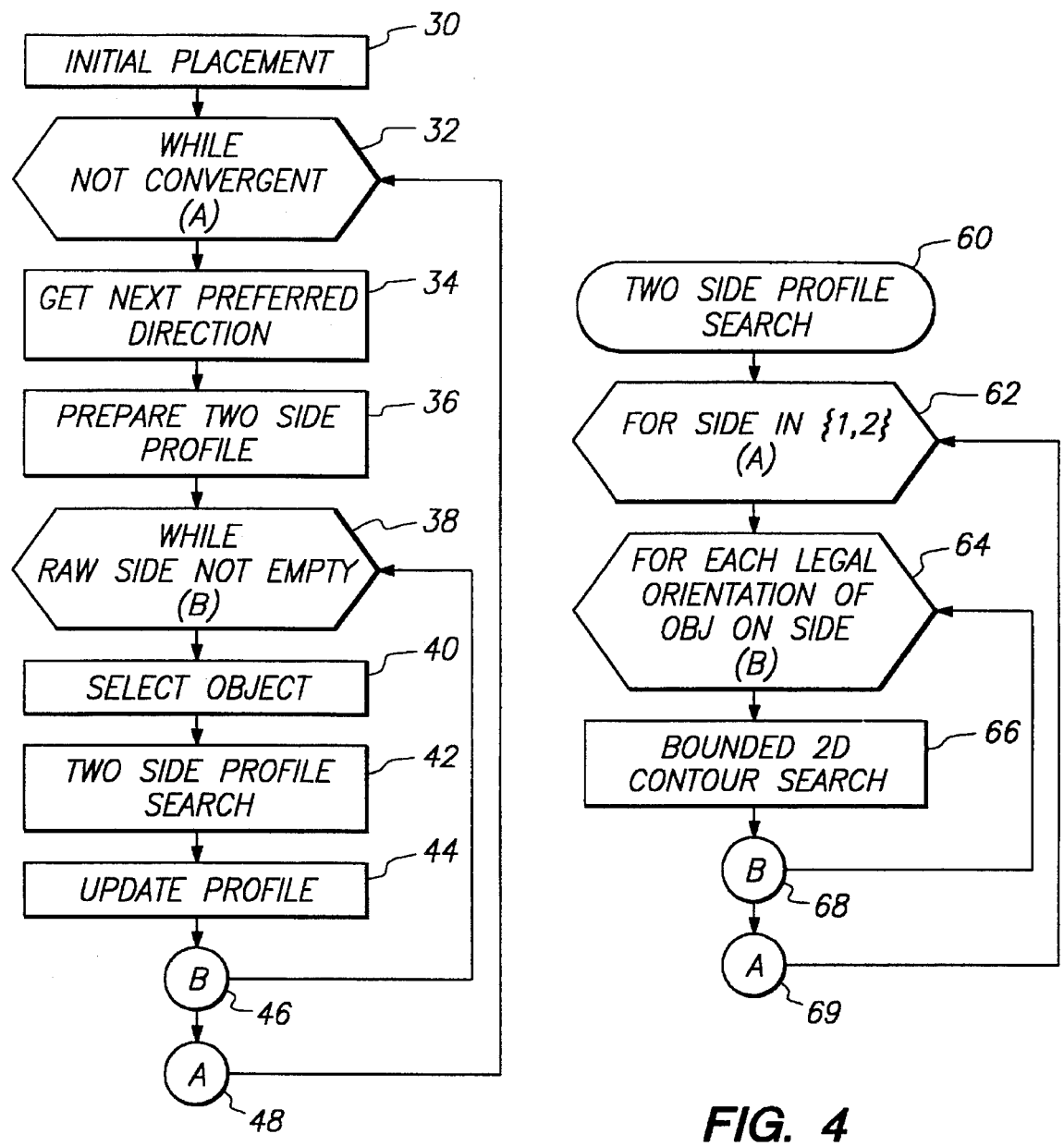
FIG. 2 is a generalized flow chart of the process steps performed by the CAE tool according to the present invention.
FIG. 4 is a generalized flow chart of a two-sided profile search used in the process shown in FIG. 2.

FIG. 1 shows a general block diagram of cooperating software modules 10 and data structures 20 used by a CAE tool configured to operate according to the present invention, and FIG. 2 is a generalized flow chart of the process steps performed by such CAE tool.

Thus, initializer module 18 functions to place initially 30 or assign a simulated or actual position or orientation of at least one object in a vacant or available location in a first designated "raw" portion of a particular PCB. Such raw portion may include a first sub-portion on the first side and a second sub-portion on the second side of such or other PCB.

In this way, while each object is so designated raw, such raw object is identified or indicated in raw-object data structure or register 22 as such. Initial component placement may be performed according to a random procedure, common or similar height or width clustering, or other conventional placement procedure employing so-called quadratic heuristic.

Additionally, "hard" placement locations may be imposed on certain components by pre-specifying fixed sites, for example, to facilitate preferential routing of critical signal paths.

Preferably, while a packing efficiency or cost value is not convergent 32, 48 (i.e., iterative cycles in calculating such cost values in subsequent component placements still indicate improving cost reduction,) iterative steps for continued re-placement are performed. In this way, a next preferred direction (e.g., up, down, left, or right) is obtained 34, and a two or multiple side profile is prepared 36, particularly for each raw and refined portion for each profiled PCB side.

In a preferred implementation, as described in co-pending patent application, Ser. No. 07/843,712, cross-referenced and incorporated above, profiling, bounded two-dimensional contour searching, placement cost calculation, and profile-searching techniques of raw and refined portions is specified in further detail.

Furthermore, while placed components remain in the raw portion 38, 46, object selector module 16 functions to select 40 or identify a placed object according to the obtained direction 34. Preferably, objects are selected 40 from one or more placed objects identified or indicated in front-end object data structure or register 28 included temporarily therein according to an object or component selection criteria.

Objects which are determined to be available or unobstructed by other objects placed in the raw portion, e.g., by being placed "on top" of the raw portion, and/or having the longest critical path or height from a placement base or raw side to a corresponding target or refined side are identified as selectable and thus indicated in front-end object register 28.

Figure 3:
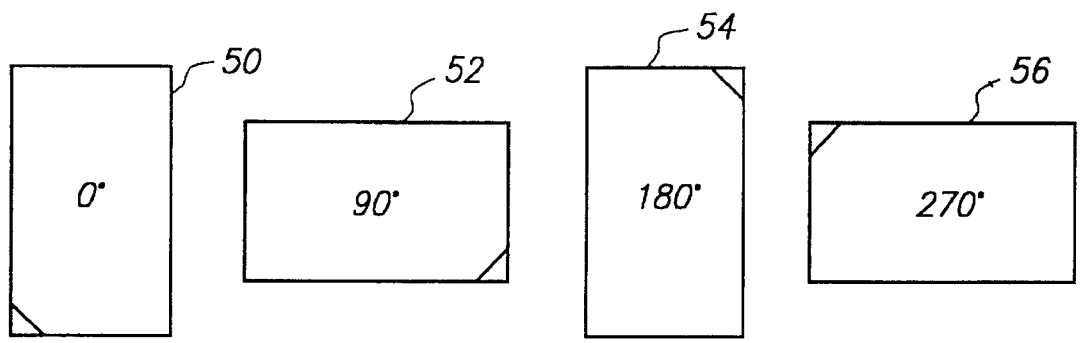
FIG. 3 is a block diagram of possible orientations for placing electronic components on a given side according to the present invention.

Next, evaluator module 14 functions to evaluate certain physical parameters or placement characteristics of a selected object to consider or search for various possible placement positions and orientations per given side 50, 52, 54, 56, such as shown in FIG. 3, and preferably in accordance with obtained placement direction 34.

According to cost-optimized evaluation, evaluator module 14 determines where to re-place such selected object in pre-defined or designated refined simulated or actual locations, preferably by calculating a packing cost or set of values corresponding to possible placement reference points or orientations of such object in a second portion of the first side of the PCB or other PCB or in a third portion of a second side of such PCB or other PCB.

For example, evaluator module 14 may consider various placement options and thereby determine re-placement of a selected component, such that a length of wire interconnecting such selected component to other components is minimized, particularly when cost is determined to include placement or packing efficiency cost as well as wiring efficiency cost.

Evaluator module 14 also functions by using re-designatable raw-profile register 26 and refined-profile register 24 when evaluating respectively raw and refined portions for two or more sided placement analysis, preferably according to two or more sided profile searching techniques 42. In particular, after two-sided profile 42 is completed, and the profiles of raw and refined portions are altered, then raw profile register 26 and refined profile register 24 are accordingly re-designated or updated 44 to indicate such altered profiles.

FIG. 4 shows a general flow chart of a two-sided profile search 60, wherein for each side 62, 69, and for each possible orientation of a component on a given side 64, 68, a bounded two-dimensional contour search 66 is performed.

Figure 5:
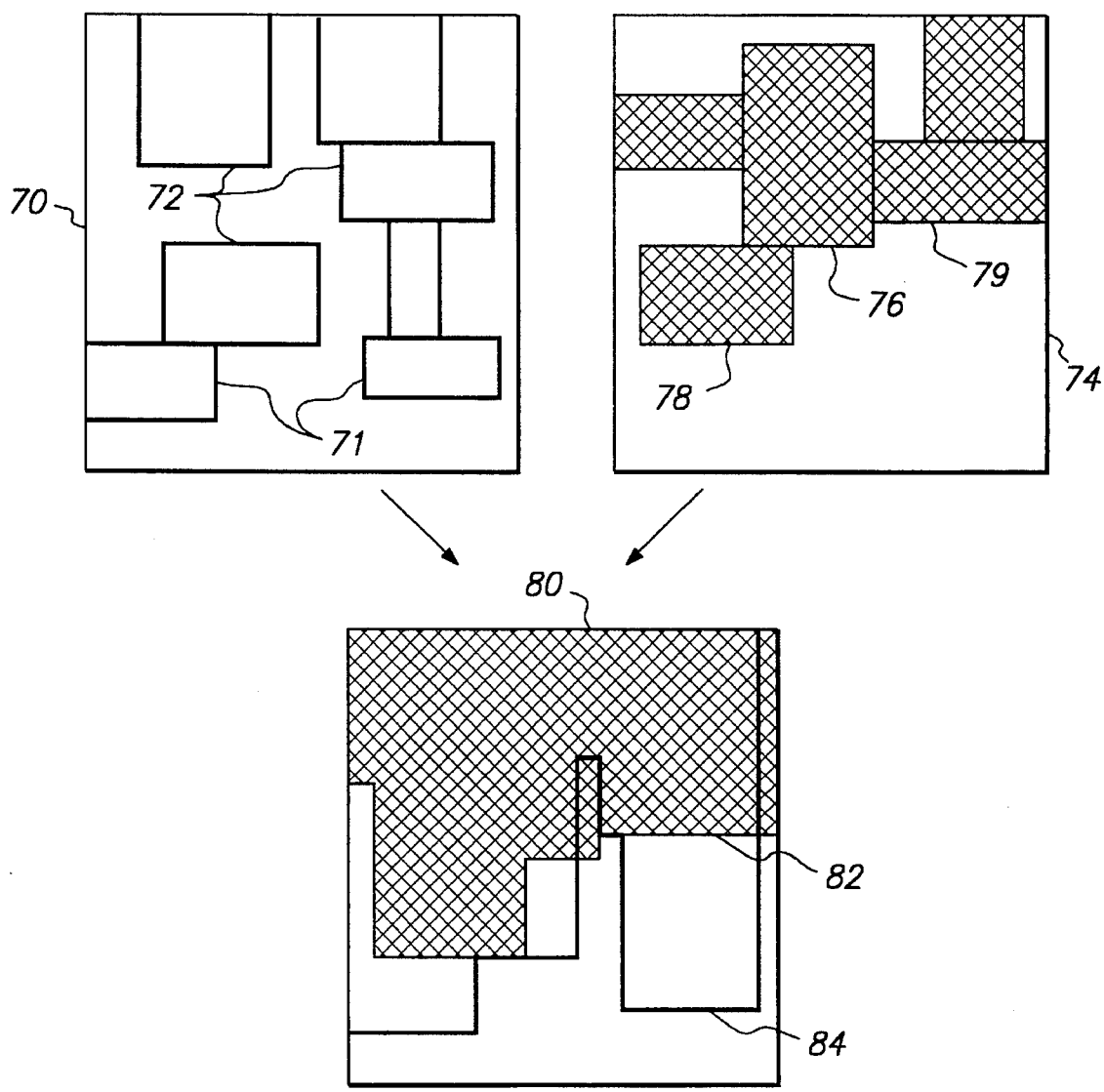
FIG. 5 is a block diagram of a representative printed circuit board, showing profiling of components on both sides of the board.

Thus, in the preferred implementation, the evaluating process involves generating a profile of the raw portion, preferably on both sides of a given PCB. For illustration, FIG. 5 is a simplified representation showing components 72, 71, 76, 78, 79 placed and profiled 84, 82 respectively on both sides 70, 74 of PCB 80. Futhermore, the evaluation process involves searching the generated profile for a placement location for the evaluated selected component in the refined portions.

A placement updater module 12 functions to define re-placement locations for such selected components in such refined portions. During each component re-placement, the states of raw-object register 22 and refined-object register 21 are modified accordingly to indicate that a certain selected component is re-located from a raw portion to a refined portion.

Preferably, object selector module 16, evaluator module 14 and placement updater module 12 function in iterative cycles such that the steps of selecting, evaluating and re-placing the selected object are repeated until each object placed in the raw portion has been selected and evaluated.

Thus, when each object placed in the raw portion has been evaluated and re-placed in the refined portion, such refined portion is redefined or re-designated as a new raw portion, and, depending on the particular newly-selected direction, the prior raw portion, which is now initially empty of objects, may be redefined or re-designated as a new refined portion. In this way, a far side of such new portion may be aligned perpendicularly with the new selection direction.

Additionally, each iterative cycle for object re-placement may be completed when a newly-calculated cost is higher than a previously-calculated cost for a completed cycle for placing all objects, i.e., whereupon cost value convergence occurs, and no cost improvement is thereby indicated between consecutive evaluations.

I claim:

1. A method for placing objects on both sides of a board, the method comprising the steps of:

placing an least one object in a first portion of a board;

selecting a placed;

evaluating a selected object for re-placement in one of a second portion of a first side of the board and a third portion of a second side of the board comprising the steps of:

generating a first profile of said first portion, said first profile including a second profile for a first sub-portion of said first portion on the first side, and a third profile for a second sub-portion on the second side; and searching said first profile for a placement location for the evaluated selected object in one of said second portion and said third portion, by considering each possible placement orientation of said selected objects; and placing the selected object in one of said second and said third portion according to the evaluation.

2. The method of claim 1 wherein:

the board comprises a rectangular printed circuit board.

3. The method of claim 1 wherein:

each object comprises a rectilinearly-shaped electronic component.

4. The method of claim 1 wherein:

each object is placed initially in the first portion according to a random procedure.

5. The method of claim 1 wherein:

the first portion comprises a first sub-portion on the first side and a second sub-portion on the second side.

6. The method of claim 1 wherein:

the steps of selecting, evaluating and placing the selected object are repeated until each object placed in the first portion has been selected and evaluated.

7. The method of claim 1 wherein:

the selected object is evaluated for re-placement in the second or third portion according to a placement direction.

8. The method of claim 7 wherein:

the placement direction comprises down, right, up, or left.

9. The method of claim 1 wherein: each object placed in the first portion is selectable for evaluation when such object is determined to be in a longest critical path.

10. The method of claim 1 wherein:

each object placed in the first portion is selectable for evaluation when such object is un-obstructed by another object in the first portion.

11. The method of claim 1 wherein:

the selected object is evaluated by calculating a value for placing such object in a position in the second or third portion.

12. The method of claim 11 wherein:

a set of values corresponding to various possible positions in the second and third portions is calculated.

13. The method of claim 11 wherein:

the value comprises a cost for packing components in a fixed-size frame.

14. The method of claim 13 wherein:

object re-placement is completed when a newly-calculated cost is higher than a previously-calculated cost for an iteration cycle such that no cost improvement is indicated between consecutive iterations of all objects.

15. The method of claim 1 wherein:

when each object placed in the first portion has been evaluated and re-placed in the second or third portion, the second or third portion is redefined as a new first portion, and the first portion is redefined as a new second or third portion.

16. The method of claim 1 wherein:

the selected object is placed such that a length of wire interconnecting such object to other objects is minimized.

17. A simulation method for placing components on both sides of a printed circuit board (PCB), the simulation method comprising the steps of:

placing a plurality of components in a raw portion of the PCB;

evaluating a selected component placed in the raw portion for re-placement in a first refined portion of the first side of the PCB or in a second refined portion of a second side of the PCB;

re-placing the selected component in the first or second refined portion according to the evaluation; and repeating the evaluating and re-placing steps until each component placed in the raw portion has been evaluated.

18. The method of claim 17 wherein:

the raw portion comprises a first sub-portion on the first side and a second sub-portion on the second side.

19. The method of claim 17 wherein:

the evaluating step comprises the steps of generating a profile of the raw portion, and searching the profile for a placement location for the evaluated selected component in the first or second refined portion.

20. A computer-assisted tool for placing objects on both sides of a board comprising:

an initializer, for placing at least one object in a first portion of a board;

an object selector, for selecting a placed object;

an evaluator, for determining where to re-place a selected object placed in the first portion in a second portion of the first side of the board or in a third portion of a second side of the board; and a placement updater, for placing the selected object in the second or third portion according to the determination.

\* \* \* \* \*

UNITED STATES PATENT AND TRADEMARK OFFICE
CERTIFICATE OF CORRECTION

PATENT NO. : 5,481,474
DATED : January 2, 1996
INVENTOR(S) : Tsu-Chang Lee

It is certified that error appears in the above-indentified patent and that said Letters Patent is hereby corrected as shown below:

COLUMN 4:
In Claim 1, line 62, after "selecting a placed" insert --object--.

Signed and Sealed this

Nineteenth Day of March, 1996

Attest:

BRUCE LEHMAN

Attesting Officer

Commissioner of Patents and Trademarks